(12) United States Patent
Landon

(10) Patent No.: US 9,744,728 B2
(45) Date of Patent: Aug. 29, 2017

(54) POROUS STRUCTURE AND METHODS OF MAKING SAME

(71) Applicant: Ryan Lloyd Landon, Southaven, MS (US)

(72) Inventor: Ryan Lloyd Landon, Southaven, MS (US)

(73) Assignee: Smith & Nephew, Inc., Memphis, TN (US)

( * ) Notice: Subject to any disclaimer, the term of this patent is extended or adjusted under 35 U.S.C. 154(b) by 451 days.

(21) Appl. No.: 14/374,100

(22) PCT Filed: Jan. 23, 2013

(86) PCT No.: PCT/US2013/022748
§ 371 (c)(1),
(2) Date: Jul. 23, 2014

(87) PCT Pub. No.: WO2013/112586
PCT Pub. Date: Aug. 1, 2013

(65) Prior Publication Data
US 2014/0371896 A1    Dec. 18, 2014

Related U.S. Application Data

(60) Provisional application No. 61/590,221, filed on Jan. 24, 2012.

(51) Int. Cl.
*G06F 19/00* (2011.01)
*B29C 67/00* (2017.01)
(Continued)

(52) U.S. Cl.
CPC ........ *B29C 67/0088* (2013.01); *B22F 3/1055* (2013.01); *B29C 67/0077* (2013.01);
(Continued)

(58) Field of Classification Search
None
See application file for complete search history.

(56) References Cited

U.S. PATENT DOCUMENTS 6,032,531 A * 3/2000 Roszhart ............... G01C 19/56
73/504.04
6,922,606 B1 * 7/2005 Yutkowitz .............. G05B 19/00
318/560

(Continued)

OTHER PUBLICATIONS

Australian Patent Office, Patent Examination Report No. 1, dated Oct. 6, 2016, 3 pages.

(Continued)

*Primary Examiner* — Adam Lee
(74) *Attorney, Agent, or Firm* — Taft Stettinius & Hollister LLP

(57) ABSTRACT

The present disclosure allows for more controlled modification of the input data to a Rapid Manufacturing Technologies (RMT) machinery to compensate for systematic error of the manufacturing process, such as directional build discrepancies, by performing the opposite effect to the input data. The modification is achieved with minimal unwanted distortions introduced to other portions of the structure to be built by decoupling the global scaling effects on the whole structure from the desired local effects on certain portions.

19 Claims, 5 Drawing Sheets

(51) Int. Cl.
  *B33Y 10/00* (2015.01)
  *G06F 17/50* (2006.01)
  *B22F 3/105* (2006.01)
(52) U.S. Cl.
  CPC .............. *B33Y 10/00* (2014.12); *G06F 17/50* (2013.01); *B22F 2003/1057* (2013.01); *Y02P 10/295* (2015.11)

(56) References Cited

U.S. PATENT DOCUMENTS

| | | | | |
|---|---|---|---|---|
| 2001/0029717 | A1* | 10/2001 | Spakousky | E04B 2/8617 52/405.4 |
| 2001/0031350 | A1* | 10/2001 | Day | B29C 70/086 428/317.9 |
| 2002/0071996 | A1* | 6/2002 | Kienzle | B82Y 10/00 430/5 |
| 2002/0138135 | A1* | 9/2002 | Duerig | A61F 2/2418 623/1.24 |
| 2003/0039535 | A1* | 2/2003 | Gourand | B66C 23/44 414/543 |
| 2004/0044401 | A1* | 3/2004 | Bales | A61F 2/88 623/1.22 |
| 2004/0133273 | A1* | 7/2004 | Cox | A61F 2/2451 623/2.11 |
| 2005/0074593 | A1* | 4/2005 | Day | B32B 5/22 428/292.1 |
| 2006/0104582 | A1* | 5/2006 | Frampton | B29C 47/0028 385/123 |
| 2007/0142914 | A1* | 6/2007 | Jones | A61F 2/30907 623/14.13 |
| 2008/0292854 | A1* | 11/2008 | Miller | C04B 38/0032 428/219 |
| 2010/0063441 | A1* | 3/2010 | Grunewald | A61B 5/02007 604/95.04 |
| 2010/0063478 | A1* | 3/2010 | Selkee | A61B 5/042 604/524 |
| 2010/0087819 | A1* | 4/2010 | Mullaney | A61B 17/62 606/56 |
| 2010/0137990 | A1* | 6/2010 | Apatsidis | A61L 27/56 623/17.16 |
| 2010/0198333 | A1* | 8/2010 | Macatangay | A61F 2/07 623/1.15 |
| 2010/0266833 | A1* | 10/2010 | Day | B29C 44/1285 428/304.4 |
| 2011/0026833 | A1* | 2/2011 | Sugino | B25J 9/1697 382/201 |
| 2011/0082578 | A1* | 4/2011 | Stanhope | G01B 5/008 700/98 |
| 2011/0124956 | A1* | 5/2011 | Mujwid | A61F 2/0045 600/30 |
| 2011/0276125 | A1* | 11/2011 | Walker | A61F 2/915 623/1.15 |
| 2013/0166059 | A1* | 6/2013 | Terada | G05B 19/182 700/189 |

OTHER PUBLICATIONS

Chinese Patent Office, First Office Action, dated Jul. 31, 2015, with English Translation, 13 pages.
European Patent Office, European Search Report, dated Oct. 22, 2015, 7 pages.
China Patent Office, Second Office Action, dated Jun. 2, 2016, 8 pages.
Japanese Patent Office, First Office Action, dated Nov. 28, 2016, 4 pages including English Translation.

* cited by examiner

POROUS STRUCTURE AND METHODS OF MAKING SAME

RELATED APPLICATIONS

This application is a United States National Phase filing of International Application No. PCT/US2013/022748 filed on Jan. 23, 2013, which claims the benefit of U.S. Provisional Application No. 61/590,221, filed Jan. 24, 2012. The disclosure of each prior application is incorporated by reference in its entirety.

FIELD OF INVENTION

The present disclosure generally relates to porous structures produced by rapid manufacturing technologies and methods of making same, and more particularly to compensating for systematic error in the manufacturing process of same.

BACKGROUND

Certain medical implants and orthopedic implants require strength for weight bearing purposes and porosity to encourage bone/tissue in-growth. For example, many orthopedic implants include porous sections that provide a scaffold structure to encourage bone in-growth during healing and a weight bearing section intended to render the patient ambulatory more quickly. Rapid manufacturing technologies (RMT), particularly direct metal fabrication (DMF) and solid free-form fabrication (SFF), have been used to produce metal foam used in medical implants or portions of medical implants. In general, RMT methods allow for structures to be built from 3-D CAD models, including tessellated/triangulated solids and smooth solids. For example, DMF techniques produce three-dimensional structures one layer at a time from a powder which is solidified by irradiating a layer of the powder with an energy source such as a laser or an electron beam. The powder is fused, melted or sintered, by the application of the energy source, which is directed in raster-scan fashion to selected portions of the powder layer. After fusing a pattern in one powder layer, an additional layer of powder is dispensed, and the process is repeated with fusion taking place between the layers, until the desired structure is complete.

While DMF can be used to provide dense structures strong enough to serve as weight bearing structures in medical implants, the porous structures conventionally used employ arrangements with uniform, non-random, and regular features that create weak areas where the struts of the three-dimensional porous structure intersect. Further, conventional porous structures with uniform, non-random, and regular features that do not resemble trabecular bone structures. The disclosures of International Application Nos. PCT/US2010/046022, PCT/US2010/046032, and PCT/U52010/056602 address these drawbacks by providing efficient methods to manufacture three dimensional porous structures, and the structures themselves, with randomized scaffold structures that provide for improved porosity without sacrificing the strength, improved strength including seamless junctions between units, and improved connectivity, as well as trabecular features. The disclosures of International Application Nos. PCT/US2010/046022, PCT/US2010/046032, and PCT/U52010/056602 are incorporated herein by reference in their entirety.

The RMT build process, however, often does not precisely form the porous structure according to the design input. In particular, due to the directionality of the build process for rapid manufacturing machinery, objects built in the X-Y plane do not necessarily look the same if built in either the Y-Z or X-Z planes. The Z-dimension (or vertical direction) is more difficult to control when the build process plots in layers oriented in the X-Y plane. In other words, an aperture oriented in the X-Z plane that is supposed to have similar shape and size to another aperture in the X-Y plane takes on a slightly different shape and size when it is built.

While this disparity is usually negligible in many cases, it is quite apparent when the built structure itself is quite small, such as structures intended for biologic ingrowth. Minor disparities caused by the RMT build process in the structures intended for biologic ingrowth can result in structures that are not optimal for its purpose. For instance, the structures can include struts that are predisposed to failure because they are thinner or more elongated than as dictated by specification or the structure may not have the optimal porosity because struts are thicker than specified, as well as the thinner or more elongated struts.

In light of the above, there is still a need for efficient methods to address directional disparities of structures built by the RMT process or other manufacturing processes that suffers from similar directional disparities, e.g., affected by relative proximity to a heat source/sink or layer-by-layer build approach, particularly structures intended for biologic ingrowth.

SUMMARY OF THE DISCLOSURE

One aspect of the present disclosure is to compensate for directional disparities in the build process of RMT equipment by modifying the features of a structure relative to a heat source/sink affecting the disparities during the build process of RMT equipment.

Another aspect of the present disclosure is to provide methods that allow features of a structure built in one plane to have similar shape and size as those built in another plane in the RMT equipment.

Another aspect of the present disclosure is to provide structures with features that have been compensated for the directional disparities in the build process of RMT equipment.

According to one aspect of the present disclosure, there is a method for fabricating a porous structure comprising the steps of: creating a model of a porous structure, said creating step comprising the steps of: defining at least one strut of said porous structure, wherein said strut comprises a first node, a second node, and a body between said first node and said second node; assigning a local coordinate system to said strut, said local coordinate system having at least one direction perpendicular to the normal vector of a first plane; modifying a dimension of said strut in said at least one direction, said modifying step does not affect any changes in said first plane; and fabricating the porous structure according to the model by exposing fusible material to an energy source.

In one embodiment, the modifying step comprises the steps of: projecting a three-dimensional volume of said strut to said first plane such that said first and second nodes lie in said first plane; applying a scaling factor to said dimension of said strut; projecting said projected three-dimensional volume in said first plane back to an original position. In another embodiment, the modifying step does not change the location of at least one of said first node and said second node.

In one embodiment, the scaling factor is based at least on an error to be compensated in a machine used to expose fusible material to an energy source. In another embodiment, the first plane comprises a build plane of said machine. In another embodiment, the scaling factor varies based at least on a distance relative to said build plane. In yet another embodiment, the dimension is selected from the group consisting of thickness and length.

According to another aspect of the present disclosure, there is provided a method for fabricating a porous structure comprising the steps of: creating a model of a porous structure, said creating step comprising the steps of: defining at least one strut of said porous structure, wherein said strut comprises a first node, a second node, and a body between said first node and said second node; assigning a local coordinate system to said strut, said local coordinate system having at least one direction perpendicular to the normal vector of a first plane; modifying a dimension of said strut in said first plane; and fabricating the porous structure according to the model by exposing fusible material to an energy source.

In one embodiment, the modifying step comprises the steps of: transforming said local coordinate system to a coordinate system of said first plane; applying a scaling factor to said dimension of said strut; transforming said coordinate system of said first plane to said local coordinate system. In another embodiment, the modifying step comprises the steps of: assigning an additional local coordinate system associated with at least one new node to said strut; transforming said strut in said local coordinate system and said additional local coordinate system to a coordinate system of said first plane; applying a scaling factor to said dimension of said strut, said scaling factor corresponds at least to said additional local coordinate system; transforming said strut in said additional coordinate system of said first plane to said local coordinate system.

In one embodiment, the modifying step is based at least on an error to be compensated in a machine used to expose fusible material to an energy source. In another embodiment, the first plane comprises a build plane of said machine. In another embodiment, the scaling factor varies based at least on a distance relative said first plane. In yet another embodiment, the dimension is selected from the group consisting of thickness and length.

Other advantages and features will be apparent from the following detailed description when read in conjunction with the attached drawings. The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the disclosed methods and apparatuses, reference should be made to the embodiments illustrated in greater detail in the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION

The present disclosure provides for methods to address directional disparities in the free-form fabrication machinery that manufacture porous structures. Preferably, the improved porous structures of the present invention are formed by using a free-form fabrication method, including rapid manufacturing techniques (RMT) such as direct metal fabrication (DMF). Typically in RMT or free-form fabrication, a model, or calculations defining the desired structure, or a computer readable file of the desired structure, is provided to a computer-aided machine or apparatus that has an energy source such as a laser beam to melt or sinter powder to build the structure one layer at a time according to the provided model.

Detailed descriptions of selective laser sintering technology may be found in U.S. Pat. Nos. 4,863,538; 5,017,753;

5,076,869; and 4,944,817, the disclosures of which are incorporated by reference herein in their entirety. Current practice is to control the manufacturing process by computer using a mathematical model created with the aid of a computer. Consequently, RMT such as selective laser re-melting and sintering technologies have enabled the direct manufacture of solid or 3-D structures from a variety of materials.

Figure 10:
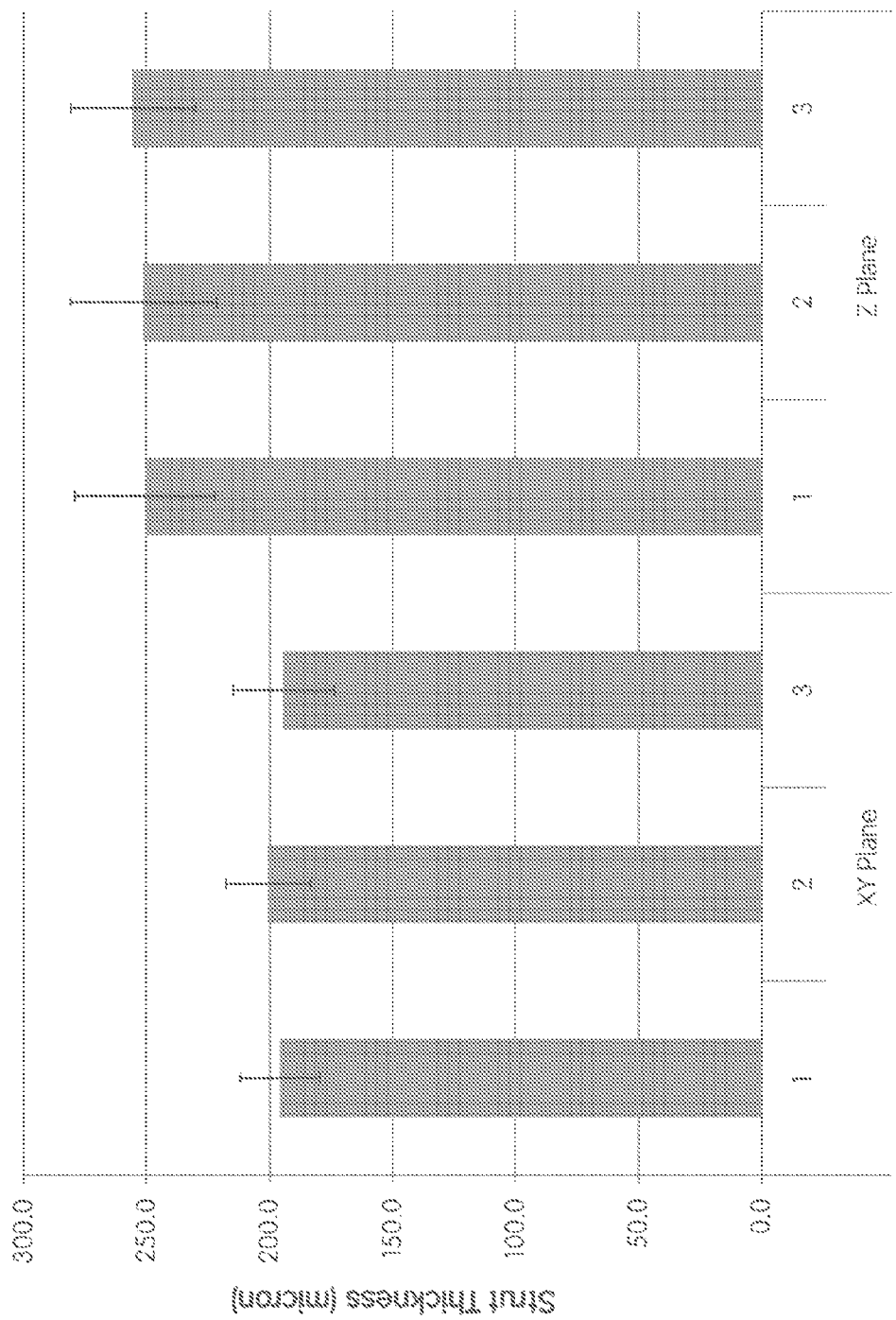
FIG. 10 shows a graph of the average thickness of various struts of the porous structure of FIG. 8B in the XY plane and the Z plane.

Due to the machinery arrangement of a heat source/sink and building of one layer or plane at a time, controlling the build process in the direction perpendicular to the layer or plane is more difficult. As such, features of a structure in the direction perpendicular to the building plane do not match up with the model as well as the features that are in the building plane. For example, FIGS. 8A-8C, 9A-9C, and 10 demonstrate this directional discrepancy for one particular RMT machine. Referring to FIGS. 8B-8C and 9B-9C, the struts built in the XY plane (shown in FIGS. 8B-8C) by this machine have a different surface roughness and appearance from the struts built in the Z plane (shown in FIGS. 9B-9C), where the struts in the Z plane are rougher and appear "fuzzier." Referring to FIG. 10, the struts in the Z plane built by this machine is slightly thicker, on average about 50 microns thicker, than struts built in the XY plane, even though both sets of struts should have the same thickness according to the input model.

As such, each RMT machinery often has a systemic disparity factor. For instance, strut thickness can be affected by laser intensity, which may be proportional to the distance from the laser (e.g., heat source). In addition, the build-platform of the equipment can also act as a heat sink, as well as the structure being built. For example, parts closer to a heat sink are more likely to have the correct dimension. Also, the relative complexity of heat flow from the heat source to the heat sink also contributes to the directional disparities of the machinery. In a porous metal structure, it is at least more difficult for the vibrating molecules of the struts to heat up adjacent molecules of metal if they are not solidly bonded, so heat dissipation is reduced.

While not intending to be limited by theory, there are several possible explanation for the systematic directional disparities. For instance, if the heat is too high, the melt pool can lose its shape and flattens out. In that case, adjacent materials bond to one another, making the part thicker than desired according to the model. On the other hand, if the heat is too low, the bond between layers possibly, and also between adjacent particles in the X-Y plane, can be less than optimal, thereby producing thinner than desired struts according to the model. Depending on the surface roughness (based on some of the other factors mentioned), the cleaning process used to get excess powder out may affect the shape and size of porous apertures. This is particularly applicable if the underside is very rough (high surface area) and an etch technique is used (more sensitive to high surface area).

In the preferred embodiment, the term "heat source" generally refers to the laser, the term "heat zone" generally refers to the layer of powder being fused, and the term "heat sink" generally refers to the build platform or a built feature that serves the same purpose. In addition, as mentioned above, heat flows associated with the heat sink also affect the build disparity. For instance, a poor heat flow region may receive only 80% of the intended heat, which may result in a 20% reduction compared to the model. Likewise, a medium heat flow region receives 90% of the intended heat, thereby yielding a 10% reduction in size as compared to the model, and a high or optimal heat flow region receives the full heat, thereby yielding a built feature according to the model or slightly thicker. A poor heat flow region is generally further away from the build platform than the medium and high heat regions. The medium heat region is further away from the build platform than the high heat region. The high heat region is closest to the build platform.

One potential solution is to compensate for this disparity for the particular RMT machinery. For instance, if it is known that the RMT machine in use builds structure in the perpendicular plane thicker than the model by a certain percent, then an operator can manually compensate for this disparity by modifying the model or instructing the machine to build structures in the perpendicular direction thinner than the model by that percent. This approach is suitable for large structures. However, it can create problems in smaller structures that require precise dimensions, such as structures intended to promote and/or support tissue ingrowth. For instance, a strut that is too thin would be predisposed to failing, and a strut that is too thick or elongated would not provide a pore size that is in the optimal range for tissue ingrowth.

Figure 1A:
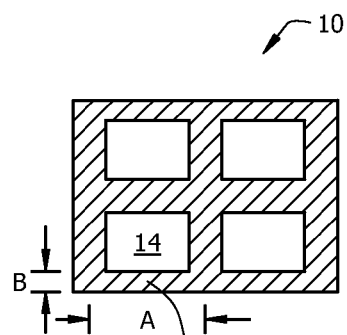
FIGS. 1A and 1B illustrate an exemplary effect on a porous structure from affine scaling.

Referring to FIG. 1A, structure 10 has strut 12 with length A and a thickness B. If a particular machine usually builds thickness B of strut 12 thinner than as specified by the input model, three-dimensional software applications that create or assist in creating the input model for RMT machinery can allow for applying affine scale factors to an input model to account for certain build directional disparity in the RMT machinery, such as a thinner strut 12 than specified. Unfortunately, any adjustment made to thickness B of strut 12 through affine scaling results in changes to the locations of the pores, such as pore 14, in structure 10. For instance, referring to FIG. 1B, when an affine scaling factor γ is applied to increase thickness B of strut 12, resulting in thickness B', length A is also affected by the same factor γ, resulting in length A'. In other words, the affine scaling can be represented as follows:

$$A'=\gamma A \quad B'=\gamma B$$

Figure 1B:
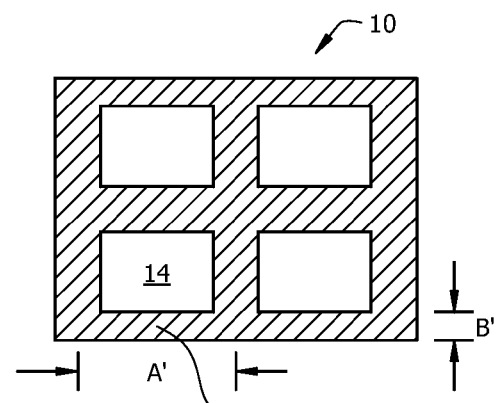

Accordingly, the affine scaling results in an increase to structure 10 in FIG. 1B. As structure 10 grows, the location of pore 14 changes, which is reflected in the greater length A'. As such, this type of affine scaling couples the changes in B', which are desired, to changes in A', which are not desired. The global scaling effects of affine scaling introduce unwanted distortions to the whole structure when only local scaling is desired The change in location or dimension of pore 14 may have minimal effects if structure 10 is a larger structure used in macro applications. However, if structure 10 is a smaller structure that requires precise dimensions, such as structures intended to promote and/or support tissue ingrowth, any minor change or movement from the ideal dimensions of an input model can result in significant structural defects that render structure 10 ineffective for its intended application. For instance, after the affine scaling, after the affine scaling, pore 14 may be greater than the desired optimal pore size that promotes tissue growth.

An example of a larger structure used in macro applications generally includes situations where the features of interest are larger than about 1 mm-2 mm. In addition, the term "large" generally refers to the ratio between a dimension and its tolerance. For instance, if the directional disparity is on the order of 0.050 to 0.25 mm and the tolerance is +/−0.3 mm, then it is unlikely compensation is necessary as the disparity falls within the accepted tolerance range. On the other hand, if the tolerance is +/−0.1 mm for the same directional disparity, then the error is undesirable and compensation is needed.

The present disclosure also provides methods to compensate for directional disparities inherent in the free-form fabrication machinery or other machinery processes that suffer from similar directional disparities with minimal unintended distortions to the modified structure. In one embodiment, the modified feature does not grow proportionally, instead, the process adds one or more layers of material to compensate for the disparity. In another embodiment, the layer of material is often less than $1/10^{th}$ of a millimeter.

According to one aspect of the present disclosure, one way of addressing the directional disparities involves non-uniform affine scaling, such as perform scaling only in the direction that needs compensation, e.g., the Z direction. One way of performing non-uniform scaling involves compressing or expanding the lattice of pores of the model of a structure. In the preferred embodiment, expanding the structure in the Z-direction is the same as shrinking the structure in the X-Y direction and scaling up the strut or the entire structure until the X-Y directions appear unchanged. Likewise, shrinking the structure or strut in the Z-direction is the same as expanding in the X-Y direction, then scaling down the strut or structure until the X-Y directions appear unchanged.

After compression or expansion, the struts of model can then be defined to give the structure thickness and form. In one embodiment, the pores preferably appears oblong and compressed (or elongated) in the Z-direction. The model can then be scaled the Z direction so that the pores end up in their original location and the struts are proportionally thickened. This approach requires modification of the entire pore structure or lattice when only a portion of the structure needs to be modified.

According to another aspect of the present disclosure, another way of addressing the directional disparities involves scaling certain portions of the structure individually by decoupling the global or overall scaling effects on the whole structure from the desired local scaling effects on the particular portions.

One embodiment to decouple the global scaling effects from the local scaling effects involve assigning local coordinate systems to certain portions of a structure in which local scaling is desired. In the preferred embodiment, one axis of the local coordinate system is oriented along the body of the strut and another axis is generally in the direction of the distortion, e.g., Z direction. Other coordinate systems that are reversible can be used to achieve the decoupling effect, as long as they allow the struts to be returned to their original locations. The local coordinates assigned allow these certain portions to be scaled in the desired direction (e.g., the direction perpendicular to the build plane, such as the Z direction), using linear algebra, by an optimal or desired amount to compensate for the machinery discrepancy. After the local coordinates are assigned, the three-dimensional (3D) volume of these portions is projected to the build plane, e.g., the transverse or X-Y plane, such that the locations of these portions to be scaled lie within that plane. These portions are then modified (e.g., increase or decrease in thickness) in the desired direction, e.g., Z-direction, by the optimal or desired amount to compensate for the machinery built discrepancy in that direction. After the portions are modified in the transverse plane, the scaled portions are projected back to their original positions where the scaled portions are larger or smaller (as desired) in the Z-direction independent of the build plane (e.g., X-Y direction). Accordingly, the local scaling does not change the locations of these scaled portions with respect to the whole structure, thereby minimizing the unwanted distortions to the structure during the scaling process.

In another embodiment, instead of projecting the 3D volume of the portions to be scaled to the transverse plane, these portions can be transformed to the transverse plane. In the preferred embodiment, a transformation is a rotation and translation that positions the new coordinate system and all associated objects in line with the other coordinate system, usually called the "global" coordinate system. Once in the transverse plane, the thickness of the portions can be modified (e.g., increase or decrease) as desired in the direction perpendicular to the build plane. The scaled portions are then transformed back to their original positions where the scaled portions are larger or smaller (as desired) in the Z-direction independent of the build plane (e.g., X-Y direction). In this embodiment, except in the X-Y plane of the local coordinate system, other regions of the scaled portions can appear slightly distorted in the build plane (e.g., X-Y plane of the machine coordinate system). Because the particular features are scaled in the Z direction when in the transverse plane or in the global coordinate system, the features can appear slightly distorted in the Z direction when the inverse transformation occur. In one embodiment, the angle of the strut with respect to the global coordinate system dictates the slight distortion, e.g., the extent of the dilation/shrink factor applied in the Z-direction. For instance, if the thickness is increased 10%, a horizontal strut is increased to 110% of its thickness. However, for a strut that is at 45 degrees to horizontal, the thickness is increased to 105% of its thickness, and a vertical strut remains unchanged. In other embodiments, rather than compensating by a certain percentage, a fixed value (e.g., 50 or 150 microns) can be assigned to compensate for the increase or decrease in strut thickness or length, as desired.

Alternatively, the local scaling effects can be performed without creating global changes by moving the z-coordinate of the points that define the strut/porous structure in the model based on the direction of the features requiring modification with respect to the horizontal direction. For instance, if the surface of a strut is faceted and those facets are parallel to the build platform, then the coordinates can be moved normal to the surface the full offset. On the other hand, if the facets are perpendicular to the build platform, then the coordinates do not move normal to their surfaces. This embodiment does not require that the struts be defined in model. Implementing local scaling through moving of the z-coordinate can require a significant amount of computational resource, as well as manipulating a three-dimensional file of the structure.

According to another aspect, the present disclosure addresses directional discrepancy in the RMT machinery particularly due to the relative distance of a portion with respect to the heat source/sink in the RMT machinery. In certain instances, portions of a structure tend to be built thicker closer to the heat source as compared to portions that are farther away, even though the input model dictates the same thickness regardless of the distance from the heat source. Similarly, portions of a structure may be thicker if further from the heat sink than portions that are closer to the heat sink. To compensate for the discrepancy due to the build distance with respect to the heat source, a gradient scaling factor or a step-wise dilation can be used. The gradient scaling factor can be a constant or varied depending on the machine or application. For instance, a structure can have a scaling gradient of 80% of the thickness of the input model at or near the heat source gradually increasing to 100% at a sufficient distance away from the heat source. Alternatively, the portion at or near the heat source can be modified according to the aspects of the present disclosure to be built at 80% the thickness, 85% at about 100 microns away from the heat source, 90% at about 200 microns away from the heat source, and so on. These numbers are merely exemplary as the scaling gradient or step-wise dilation is preferably selected based at least upon the specific directional discrepancy and/or operation conditions of the particular machinery used.

In a specific embodiment of a method for changing the shape of the features of a structure to account for variations in the direction perpendicular to the building plane or layer, the feature needing change, e.g., a strut, is isolated and scaled individually to avoid unwanted distortions to other features of the structure, such as pores. This is preferably achieved by decoupling the global scaling effects on the entire structure through affine scaling of the struts from the local scaling effects desired on the individual features or struts.

In one embodiment, there is a structure model input for the RMT machine with ideally placed struts and nodes to define the desired pores configuration as if the machine would build the features of the structure according to the model without any build disparity. In a specific embodiment, referring to FIG. 2, strut 200 preferably comprises first end 202, second end 204, and continuous elongated body 206 between first end 202 and second end 204. Body 206 has a selected or predetermined thickness and a length. In the preferred embodiment, first end 202 and second end 204 serve as the nodes of strut 200 where a node can comprise an intersection between one end of a first strut and the body of a second strut, intersection between one end of a first strut and one end of a second strut, and/or an intersection between one end of a strut and any other portion of the overall structure.

In the interest of clarity and keeping things simple, only strut 200 of a larger structure (not shown) is provided in the figures and discussed herein for exemplary purposes. It is understood that the various aspects of the present disclosure are applicable to modify a plurality of struts or various portions of a structure to be built by RMT machinery. In one embodiment, strut 200 is defined as if the RMT machine can produce perfect parts ever time as dictated by the input model without any directional discrepancy. In the preferred embodiment, defining the ideal strut includes identifying all surfaces and/or volume for each region between the nodes. For instance, this includes defining certain properties of body 206 of strut 200. These properties include strut diameter, longitudinal shape, cross-sectional shape, sizes, shape profiles, strut thickness, material characteristics, strength profiles, or other properties. This is the ideal input model of strut 200.

Figure 2:
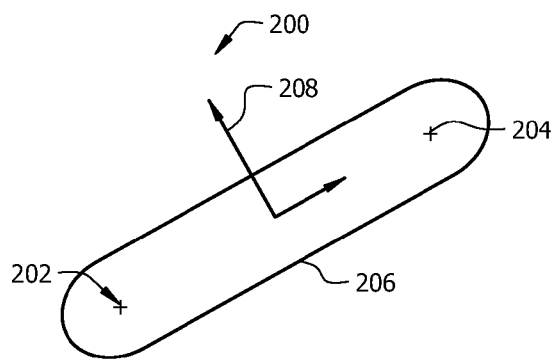
FIG. 2 illustrates a strut having a local coordinate system that is separate from a machine coordinate system according to the aspects of the present disclosure.

Referring to FIG. 2, in one embodiment, the ideal model of strut 200 is assigned local or node coordinate system 208 which is different from machine coordinate system 210. Local or node coordinate system 208 allows for scaling of strut 200 to compensate for the build directional discrepancy of the particular machine without introducing unwanted distortions to the larger structure (not shown) of which strut 200 is a part. For instance, a particular RMT machine can have a systematic dilation problem, such as a build directional discrepancy in the direction perpendicular to the build plane where the machine tends to produce a structure with thicker struts or other features that are thicker near the heat source and thinner in the direction perpendicular to the build plane moving away from the heat source. The relative distance to a heat sink or the heat flow can also contribute to the systematic dilation error of the machinery, as discussed above.

One way of minimizing unwanted distortions in the compensation process is to maintain the locations of struts 202 and 204 while modifying the thickness of body 206 of strut 200 through the use of local coordinate system 208. Preferably, linear algebra is used to scale the thickness of body 206.

Figure 3:
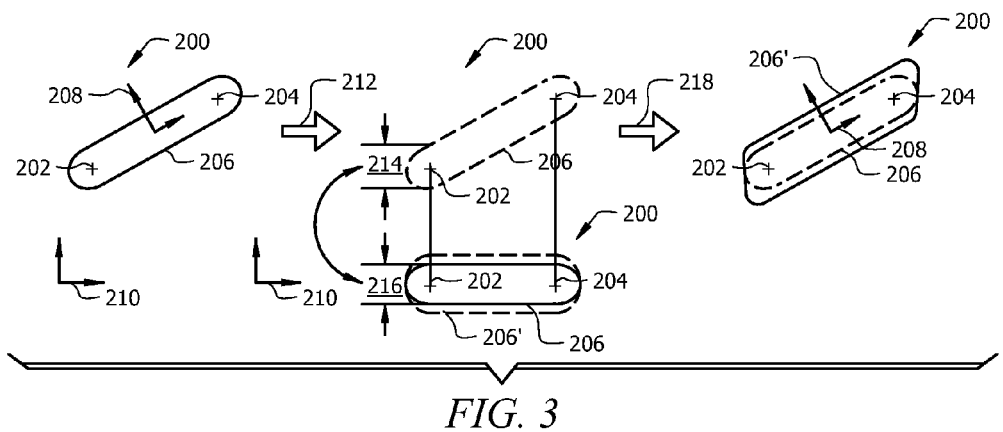
FIG. 3 illustrates a first embodiment to scale a strut according to the aspects of the present disclosure.

Referring to FIG. 3, in one embodiment, the 3D volume of strut 200 is projected to a plane where no changes are desired such that nodes 202 and 204 lie in that plane. The projection is shown as arrow 212. When strut 200 is projected to the new plane, it still retains certain 3D properties. In one embodiment, this plane is the build plane or machine coordinate system 210 such as the transverse or X-Y plane in which, in some instances, the energy absorbed from the heat source of the machine by the portions of the structure in that plane is substantially the same. Body 206 has the same thickness 214 prior to the projection as the thickness 216 when strut 200 is projected to the plane with machine coordinate system 210. Once in this plane, body 206 is dilated or shrunk as appropriate to compensate for the build directional discrepancy of the particular machine, resulting in body 206'. For instance, if the machine exhibits a tendency to build thicker struts of about 25% toward the heat source in the direction perpendicular to the build plane (e.g., Z-direction), then a 80% scaling factor may be applied in this perpendicular direction to achieve a thickness of about 100% as dictated by the input model rather than the greater thickness of 125%. The compensation addresses the systematic error of the manufacturing process by performing the opposite effect to the input data. The scaling factor may be applied in a gradient fashion or step-wise fashion as discussed above, depending on the build discrepancies exhibited by the particular machine. After the desired scaling factor has been applied, strut 200 is projected back to its original position, indicated by arrow 218. Strut 200, now with body 206', is respectively scaled in the Z-direction (or the direction needing compensation) independent of the X-Y direction (or the build plane). When strut 200 is scaled in the build plane having machine coordinate system 210 and projected back to local coordinate system 208, the locations of nodes 202 and 204 do not change. As such, the scaling of the thickness of body 206 occurs locally and does not cause any unwanted distortions to the locations of nodes 202 and 204. In this embodiment, strut 200 is scaled with respect to machine coordinate system 210.

Although not wanting to be bound by theory, the following example provides a general analogy of the projection process described above. The strut can be considered a loaf of bread that is sliced according to a first coordinate system, which results in slices that are angled. To project the loaf of bread to a second plane, the slices are placed next to one other as if they belonged in a nice straight loaf. In this new plane, the new loaf will look shorter and larger than before it was sliced in the first coordinate. In the new loaf of the second coordinate system, each slice may have different heights depending on how even the loaf was before the slicing. The slices of the new loaf in the second coordinate system (i.e., new plane) is stretched in the desired direction by the desired amount. The slices are then projected back into the first coordinate system where the slices are placed next to each other in their angled position, the whole loaf is now stretched in the desired direction.

Figure 4:
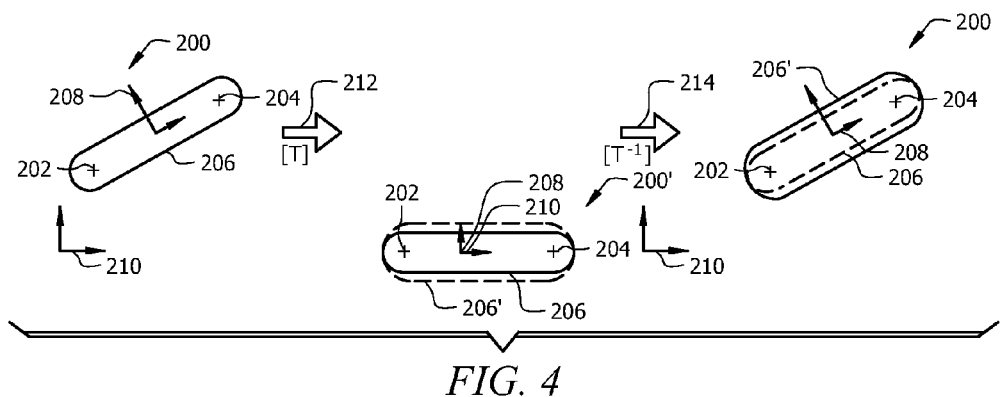
FIG. 4 illustrates a second embodiment to scale a strut according to the aspects of the present disclosure.

Referring to FIG. 4, in another embodiment, strut 200 can be scaled with respect to local coordinate system 208. In particular, strut 200 is transformed, as indicated by arrow 212, to a plane where no changes are desired, such as the transverse plane as described above. In the preferred embodiment, this transformation is achieved using transformation matrices, such as [T] and [T]$^{-1}$, where [T]≡rotate and/or translate to machine coordinate system 210, as indicated by arrow 212, and [T]$^{-1}$≡rotate and transform to node coordinate system 208, as indicated by arrow 214. When strut 200 is transformed to the plane having machine coordinate system 210, local coordinate system 208 of strut 200 is the same as machine coordinate system 210. An exemplary transformation matrix that can be used is kinematic matrix; however, other suitable transformation matrices can also be used. In other embodiments, Cardan angles, Euler angles, or any other method of rotating and translating to the desired position can be used. After strut 200 is transformed to the plane having machine coordinate system 210, the thickness of body 206 can be scaled as desired according to whether the machine discrepancies dictate increasing or decreasing the thickness of body 206. Scaling or modifying of at least one dimension of body 206 results in body 206' with the changed dimension. After the desired scaling is performed, strut 200' is transformed back to local coordinate system 208, as indicated by arrow 214. Strut 200 is scaled with respect to local coordinate system 208 in this embodiment. Strut 200, now with body 206', has a new thickness as compared to body 206 prior to the scaling where the locations of nodes 202 and 204 remains less distorted than they would have been had an affine factor been applied.

Figures 5A, 5B:
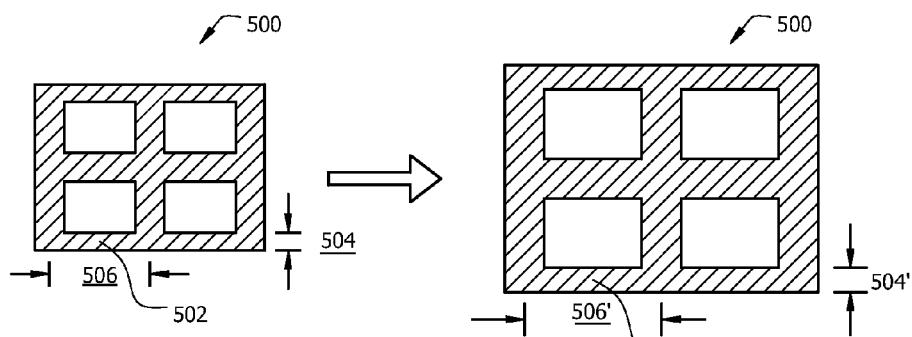
FIG. 5 illustrates a third embodiment to scale a strut according to the aspects of the present disclosure.
Figure 6:
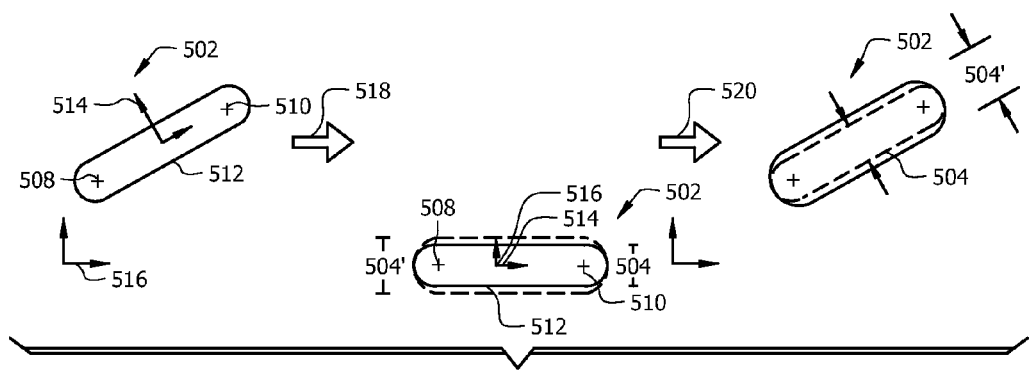
FIGS. 6 and 7 illustrate exemplary ways to implement the third embodiment of FIG. 5.
Figure 7:
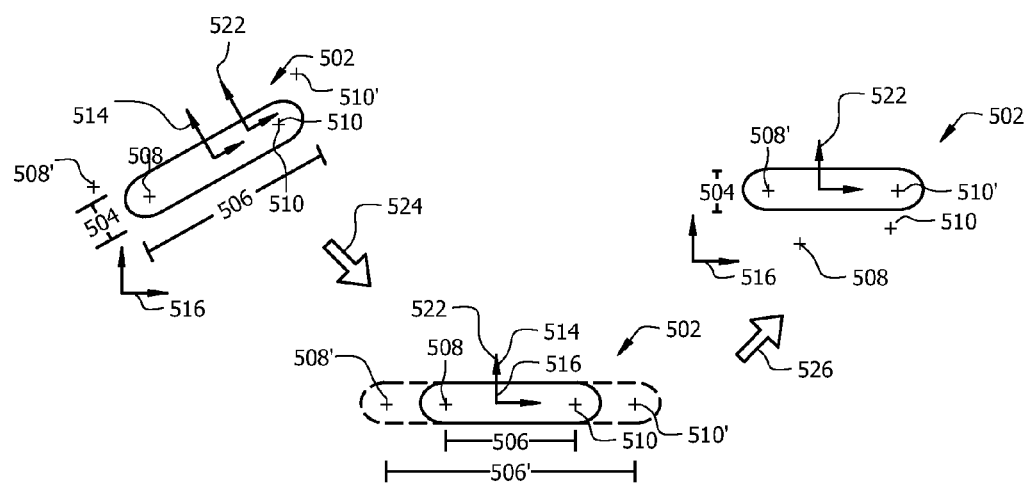
Figure 8A:
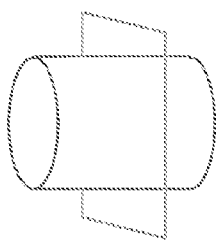
FIG. 8A illustrates the XY plane of a structure.
Figure 8B:
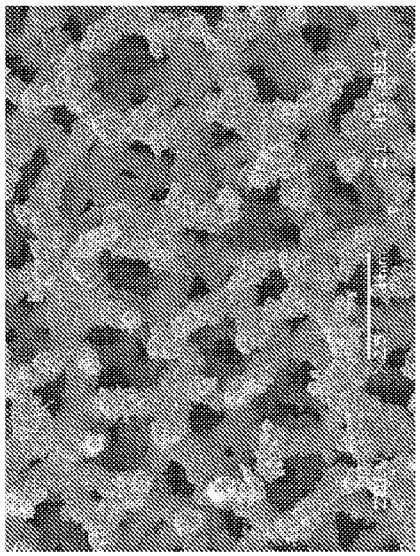
FIG. 8B is a scanning electron microscope (SEM) image of the XY plane (as shown in FIG. 8A) of a portion of a porous structure taken at 25× magnification.
Figure 9B:
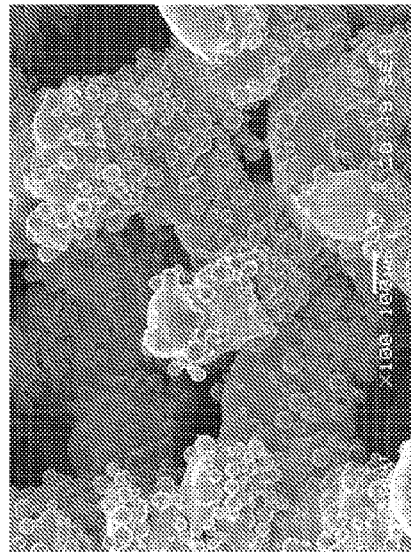
FIG. 9B is a scanning electron microscope (SEM) image of the Z plane (as shown in FIG. 9A) of a portion of the porous structure of FIG. 8B taken at 25× magnification.
Figure 9A:
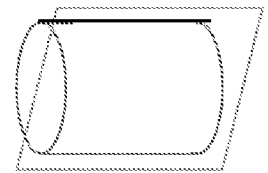
FIG. 9A illustrates the Z plane of the structure of FIG. 8A.
Figure 8C:
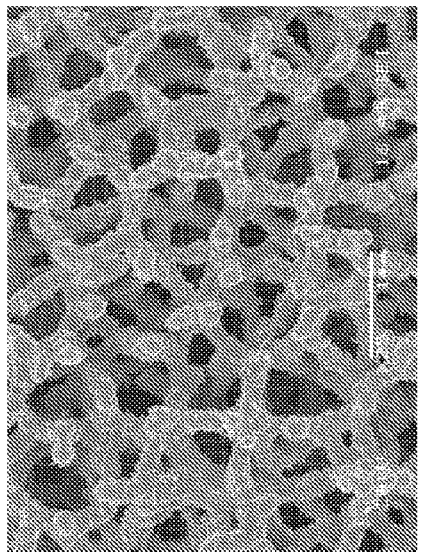
FIG. 8C is a scanning electron microscope (SEM) image of the XY plane (as shown in FIG. 8A) of a portion of the porous structure of FIG. 8B taken at 100× magnification.
Figure 9C:
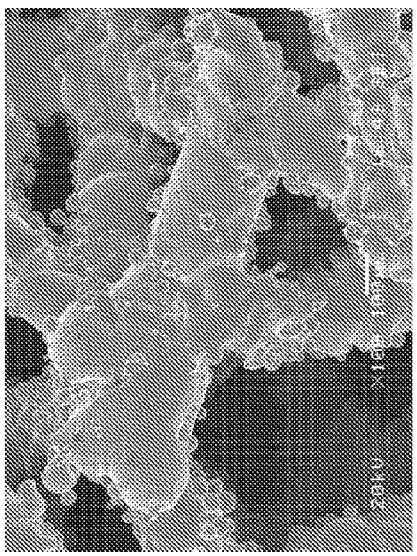
FIG. 9C is a scanning electron microscope (SEM) image of the Z plane (as shown in FIG. 9A) of a portion of the porous structure of FIG. 8B taken at 100× magnification.

In some instances, when more than one strut is present in a structure, the machinery discrepancies may require scaling of the thickness of one strut as well as scaling of the length of that strut. The various aspects of the present disclosure can be employed to individually address the different directional requirements without coupling the changes to the overall structure. Referring to FIG. 5A, there is structure 500 with strut 502 having thickness 504 and length 506, which is scaled according to the aspects of the present disclosure into structure 500 of FIG. 5B with strut 502 having thickness 504' and length 506'. An exemplary process to scale thickness 504 of strut 502 is depicted in FIG. 6, and an exemplary process to scale length 506 of strut 502 is depicted in FIG. 7. In the preferred embodiment, the scaling of thickness 504 occurs independently of length 506. In other words, the decoupled scaling can be represented as follows:

504'=γ504 506'=ξ506 where γ≠ξ and γ, ξ can be >1, <1, or =1.

Referring to FIG. 6, a first step to compensating for a known build error in the manufacturing process of structure 500 depicted in FIG. 5 comprises defining nodes 508 and 510 of strut 502 This includes defining the locations of nodes 508 and 510 with respect to structure 500 and/or the distance between nodes 508 and 510. The process further comprises the step of identifying all surfaces and/or volume for each region between nodes 508 and 510. For instance, this includes defining certain properties of body 512 of strut 502. These properties include strut diameter, longitudinal shape, cross-sectional shape, sizes, shape profiles, strut thickness, material characteristics, strength profiles, or other properties.

The process further includes assigning local coordinate system 514 to strut 502, which is different from machine coordinate system 516. In the preferred embodiment, the machine coordinate system 516 is the coordinate system of the feature that is the primary heat sink of the machine, e.g., the coordinate system within the machine that dictates this systematic build error needing correction. The locations of nodes 508 and 510 is maintained while thickness 504 is scaled, thereby introducing the opposite effect to the input data of the machine to counter the systematic error of the manufacturing process with minimal unwanted distortions to structure 500. The thickness compensation can be achieved with respect to the coordinate system of the machine or with respect to the local coordinate system, as discussed above.

To scale thickness 504 relative to local coordinate system 514, strut 502 is transformed to a plane where no changes are desired, such as the transverse plane as described above having machine coordinate system 516. In the preferred embodiment, this transformation is achieved using transformation matrices, such as [T] and [T]$^{-1}$, where [T]≡rotate and/or translate to machine coordinate system 516, as indicated by arrow 518, and [T]$^{-1}$≡rotate and transform to node coordinate system 514, as indicated by arrow 520. An exemplary transformation matrix that can be used is kinematic matrix. Thickness 504 is scaled in machine coordinate system 516 as desired, resulting in thickness 504'. The scaling factor is preferably based at least on whether the machine build discrepancies dictate increasing or decreasing the thickness of body 512. After the desired scaling is performed, strut 502 is transformed back to local coordinate system 514, as indicated by arrow 520. After strut 502 is scaled, it has new thickness 504' as compared to the old thickness 504.

To scale thickness 504 relative to machine coordinate system 516, the 3D volume of strut 502 is projected to a plane where no changes are desired such that nodes 202 and 204 lie in that plane. In one embodiment, this plane is the build plane or machine coordinate system 516 such as the transverse or X-Y plane as discussed above. Once in this plane, body 512 is dilated or shrunk as appropriate to compensate for the build directional discrepancy of a particular machine. The compensation addresses the systematic error of the manufacturing process by performing the opposite effect to the input data. The scaling factor may be applied in a gradient fashion or step-wise fashion as discussed above, depending on the build discrepancies exhibited by the particular machine. After thickness 504 is modified as desired, strut 502 is projected back to its original position, in which thickness 504' is larger or smaller in the direction needing compensation independent of the build plane.

Referring to FIG. 7, in one embodiment, length 506 can be modified with minimal unwanted distortions introduced to structure 500 depicted in FIG. 5A by scaling the locations of node 508 and/or node 510 in machine coordinate system 516 to maintain thickness 504 and transforming strut 502 back to local coordinate system 514. Before strut 502 is transformed to machine coordinate system 516, it is assigned new nodes 508' and 510', which have their own local coordinate system 522. Both local coordinate systems 514 and 522 are transformed to machine coordinate system 516 using transformation matrices [T], which is described above, for the original locations of nodes 508 and 510 and [T$_{new}$] for the new locations of nodes 508' and 510', where [T$_{new}$]≡rotate and/or translate from local coordinate system 522 to machine coordinate system 516. The transformation using [T] and [T$_{new}$] is indicated by arrow 524. Referring to FIG. 7, after strut 502 is transformed to machine coordinate system 516, as shown, local coordinate system 514, local coordinate system 522, and machine coordinate system 516 match up to one another. After scaling is performed in the machine coordinate system 516 to provide strut 502 with new length 506' and new corresponding nodes 518 and 520, only new local coordinate system 522 is transformed back to machine coordinate system 514 using $[T_{new}]^{-1}$, where $[T_{new}]^{-1}$=rotate and transform from machine coordinate system 516 to node coordinate system 522, as indicated by arrow 526. This transformation results in the compensation scaling of length 506' in the data to be inputted to the machine for manufacturing. After scaling and transformation back to local coordinate 522, strut 502 has new nodes 508' and 510', which reflect the changes in length 506 as compared to old nodes 508 and 510, while thickness 504 remains the same.

Alternatively, the projection method described with respect to FIG. 3 can also be used to compensate for the length of strut 502. In this embodiment, except in the X-Y plane of the build plane, other regions of the scaled (i.e., lengthened or shortened) portions can appear slightly distorted. The angle of the strut with respect to the build plane dictates the slight distortion, e.g., the extent of the dilation/shrink factor applied in the Z-direction. For instance, a length scaling of a horizontal strut using the projection method achieves the full effect of the length scaling while a vertical strut does not receive any lengthening effect, rather it gets thicker. The length of a strut that is at an angle can be scaled based the knowledge of that angle and the lengthening percent so that a vertical strut does not receive any length scaling while a horizontal one receives the full amount. In between, the scaling factor applied to the length of a strut at an angle can be altered accordingly, such as by the cosine of the angle times the full amount of the scaling factor applied to a horizontal strut. The "horizontal" and "vertical" references are made with respect to the heat source of the particular machine.

In one embodiment, if an object is scaled in the Z direction without affecting features in the X or Y direction, then scaling in the X or Y direction can be performed independently. In the preferred embodiment, it may be desirable to identify whether the strut most aligns with X or Y and then using the angle between the projected strut in the X-Y plane and the closest axis. The lengthening procedure can be applied in that direction and proportional to the angle calculated.

The order of modification or compensation, e.g., thickness or length, preferably does not matter. The embodiments of the present disclosure make the local coordinate system and global coordinate systems align. Therefore, many of the issues with order disappear.

The process of compensating for the build discrepancy of a machine can be done before the defined struts are written to a computer file to be read by the RMT machine. Alternatively, it can be done simultaneously as the struts are being defined. In another embodiment, the compensation for systematic error of the manufacturing process can be done after the ideal model has been converted to a computer readable file for the RMT machine and transferred to the machine, where machinery settings are added. In the preferred embodiment, the compensation is performed after the struts are defined.

According to another embodiment, a computer program product can be employed to implement or execute the embodiments of the present disclosure. For example, the computer program product preferably comprises a non-transitory computer readable medium having code to assign local coordinate systems to certain portions of a structure in which local scaling is desired. The medium also includes code to project the three-dimensional (3D) volume of these portions to the build plane, e.g., the transverse or X-Y plane, such that the locations of these portions to be scaled lie within that plane. The medium further includes code to modify these portions (e.g., increase or decrease in thickness or length or any other dilation compensations desired) in the desired direction, e.g., Z-direction, by the optimal or desired amount to compensate for the machinery built discrepancy in that direction. The medium also includes code to project the scaled portions back to their original positions after the portions are modified in the transverse plane.

In another embodiment, the medium also includes code to transform to the transverse plane. The medium also includes code to modify the dimensions of the portions as desired (i.e., in the direction perpendicular to the build plane) in the transverse plane. The medium also includes code to transform the scaled portions back to their original positions where the scaled portions are larger or smaller (as desired) in the Z-direction independent of the build plane (e.g., X-Y direction).

According to a further embodiment, there is a system that includes a processor coupled to a memory, in which the processor is configured to implement or execute the embodiments of the present disclosure. For example, the processor is configured to assign local coordinate systems to certain portions of a structure in which local scaling is desired. The processor is also configured to project the three-dimensional (3D) volume of these portions to the build plane, e.g., the transverse or X-Y plane, such that the locations of these portions to be scaled lie within that plane. The processor is further configured to modify these portions (e.g., increase or decrease in thickness or length or any other dilation compensations desired) in the desired direction, e.g., Z-direction, by the optimal or desired amount to compensate for the machinery built discrepancy in that direction. The processor is also configured to project the scaled portions back to their original positions after the portions are modified in the transverse plane.

In another embodiment, The processor is also configured to transform to the transverse plane. The processor is also configured to modify the dimensions of the portions as desired (i.e., in the direction perpendicular to the build plane) in the transverse plane. The processor is also configured to transform the scaled portions back to their original positions where the scaled portions are larger or smaller (as desired) in the Z-direction independent of the build plane (e.g., X-Y direction).

The embodiments of the systems of the present invention may include one or more computer systems to implement the various methods of the present invention. One exemplary computer system may include a central processing unit (CPU), which may be any general-purpose CPU. The present invention is not restricted by the architecture of the CPU or other components of the systems of the present invention as long as the CPU and other components support the inventive operations as described herein. The CPU may execute the various logical instructions according to embodiments of the present invention. For example, the CPU may execute the code to determine the various embodiments as described above.

In addition, the exemplary computer system may also include random access memory (RAM), which may be SRAM, DRAM, SDRAM, or the like. The embodiments may also include read-only memory (ROM) which may be PROM, EPROM, EEPROM, or the like. The RAM and ROM hold user and system data and programs, as is well known in the art.

The exemplary computer system also includes input/output (I/O) adapter, communications adapter, user interface adapter, and display adapter. I/O adapter, user interface adapter, and/or communications adapter may, in certain embodiments, enable a user to interact with the computer system in order to input information and obtain output information that has been processed by the computer system.

The I/O adapter preferably connects to one or more storage device(s), such as one or more of hard drive, compact disc (CD) drive, floppy disk drive, tape drive, etc. to the exemplary computer system. The storage devices may be utilized when the RAM is insufficient for the memory requirements associated with storing data for operations of the elements described above (e.g., clam adjudication system, etc.). The communications adapter is preferably adapted to couple the computer system to a network, which may enable information to be input to and/or output from the computer system via the network (e.g., the Internet or other wide-area network, a local-area network, a public or private switched telephony network, a wireless network, any combination of the foregoing). The user interface adapter couples user input devices, such as keyboard, pointing device, and microphone and/or output devices, such as speaker(s) to the exemplary computer system. The display adapter is driven by the CPU to control the display on the display device, for example, to display the model of the structures to be modified by the various embodiments as described above.

It shall be appreciated that the present invention is not limited to the architecture of the exemplary computer system. For example, any suitable processor-based device may be utilized for implementing the various elements described above (e.g., software for presenting the user interfaces, claim adjudication system, etc.), including without limitation personal computers, laptop computers, computer workstations, and multi-processor servers. Moreover, embodiments of the present invention may be implemented on application specific integrated circuits (ASICs) or very large scale integrated (VLSI) circuits. In fact, persons of ordinary skill in the art may utilize any number of suitable structures capable of executing logical operations according to the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a porous structure with a machine, the method comprising the steps of:
    creating a model of said porous structure to be fabricated by said machine, wherein said model defines a strut of said porous structure comprising a first node, a second node, and a body between said first node and said second node;
    assigning a local coordinate system to said strut, said local coordinate system different from a machine coordinate system that defines a build plane of said machine;
    correcting a directional discrepancy of said machine by modifying a dimension of said strut in a direction perpendicular to said build plane, wherein said modifying step does not affect any changes to locations of said first node and said second node and comprises the steps of:
        transforming said local coordinate system to said machine coordinate system of said build plane;
        applying a scaling factor to said dimension of said strut in response to transforming said local coordinate system to said machine coordinate system; and
        transforming said machine coordinate system of said build plane to said local coordinate system in response to applying the scaling factor; and
    fabricating, by the machine, the porous structure according to the model having the modified strut by exposing fusible material to an energy source.

2. The method of claim 1, wherein the dimension is selected from the group consisting of thickness and length.

3. The method of claim 1, wherein transforming said local coordinate system to said machine coordinate system comprises projecting a three-dimensional volume of said strut to said build plane in said machine coordinate system such that said first and second nodes lie in said build plane;
    wherein applying the scaling factor to said dimension comprises applying a scaling factor to said dimension of said strut projected to said build plane to generate a scaled three-dimensional volume; and
    wherein transforming said machine coordinate system of said build plane to said local coordinate system comprises projecting said scaled three-dimensional volume in said build plane back to an original position in said local coordinate system.

4. The method of claim 3, wherein the scaling factor is based at least on an error associated with the directional discrepancy to be compensated in said machine used to expose said fusible material to said energy source.

5. The method of claim 1, wherein correcting the directional discrepancy of said machine comprises modifying a dimension of said strut in a direction perpendicular to said build plane for each strut of a plurality of struts.

6. The method of claim 1, wherein the scaling factor is based on a gradient function that varies from said energy source to said build plane based on a distance of said strut relative to said energy source.

7. The method of claim 1, wherein said build plane is a build platform of said machine.

8. The method of claim 1, wherein creating said model of said porous structure comprises creating an ideal model of an ideal porous structure to be fabricated by said machine;
    wherein correcting said directional discrepancy of said machine comprises modifying a dimension of said strut of said ideal model in a direction perpendicular to said build plane for each strut of a plurality of struts of said ideal model to generate a scaled model; and
    wherein fabricating said porous structure comprises fabricating said ideal porous structure based on said scaled model.

9. The method of claim 1, wherein correcting said directional discrepancy comprises modifying the dimension of said strut by a factor dependent on an angle of said strut relative to said build plane.

10. The method of claim 9, wherein said factor is equal to a scaling factor of the dimension of said strut when said strut is parallel to said build plane multiplied by a cosine of the angle of said strut relative to said build plane.

11. A method for fabricating a porous structure with a machine, the method comprising the steps of:
creating a model of said porous structure to be fabricated by said machine, wherein said model defines a strut of said porous structure comprising a first node, a second node, and a body between said first node and said second node;
assigning a local coordinate system to said strut, said local coordinate system different from a machine coordinate system that defines a build plane of said machine;
correcting a directional discrepancy of said machine by modifying a dimension of said strut in a direction perpendicular to said build plane, wherein said modifying step comprises the steps of:
transforming said local coordinate system to said machine coordinate system of said build plane;
applying a scaling factor to said dimension of said strut in response to transforming said local coordinate system to said machine coordinate system; and
transforming said machine coordinate system of said build plane to said local coordinate system in response to applying the scaling factor; and
fabricating, by the machine, the porous structure according to the model having the modified strut by exposing fusible material to an energy source.

12. The method of claim 11, wherein transforming said local coordinate system to said machine coordinate system comprises projecting a three-dimensional volume of said strut to said build plane in said machine coordinate system such that said first and second nodes lie in said build plane;
wherein applying the scaling factor to said dimension comprises applying a scaling factor to said dimension of said strut projected to said build plane to generate a scaled three-dimensional volume; and
wherein transforming said machine coordinate system of said build plane to said local coordinate system comprises projecting said scaled three-dimensional volume in said build plane back to an original position in said local coordinate system.

13. The method of claim 12, wherein the scaling factor varies based at least on a distance of said strut relative to said build plane.

14. The method of claim 11, wherein the modifying step is based at least on an error associated with the directional discrepancy to be compensated in said machine used to expose said fusible material to said energy source.

15. The method of claim 11, wherein the dimension is selected from the group consisting of thickness and length.

16. The method of claim 11, wherein the scaling factor varies based at least on a distance of said strut relative said first plane.

17. A method for fabricating a porous structure with a machine, the method comprising the steps of:
creating a model of said porous structure to be fabricated by said machine, wherein said model defines a strut of said porous structure comprising a first node, a second node, and a body between said first node and said second node;
assigning a local coordinate system to said strut, said local coordinate system different from a machine coordinate system that defines a build plane of said machine;
correcting a directional discrepancy of said machine by modifying a dimension of said strut in a direction perpendicular to said build plane, wherein the modifying step is based at least on an error to be compensated for in said machine, and wherein the modifying step comprises the steps of:
transforming said local coordinate system to said machine coordinate system of said build plane;
applying a scaling factor to said dimension of said strut in response to transforming said local coordinate system to said machine coordinate system; and
transforming said machine coordinate system of said build plane to said local coordinate system in response to applying the scaling factor; and
fabricating, by the machine, the porous structure according to the model having the modified strut by exposing the fusible material to the energy source.

18. The method of claim 17, wherein the dimension is selected from the group consisting of thickness and length.

19. The method of claim 17, wherein the modifying step does not change a location of said first node and does not change a location of said second node.

* * * * *